United States Patent
Candage et al.

[19]

[11] Patent Number: 5,959,490
[45] Date of Patent: Sep. 28, 1999

[54] HIGH SPEED LOW VOLTAGE SWING RECEIVER FOR MIXED SUPPLY VOLTAGE INTERFACES

[75] Inventors: Anthony B. Candage, Port Moody; George Deliyannides, New Westminister, both of Canada

[73] Assignee: PMC-Sierra Ltd., Burnaby, Canada

[21] Appl. No.: 08/987,446

[22] Filed: Dec. 10, 1997

[51] Int. Cl.[6] ...................................................... H03L 5/00
[52] U.S. Cl. .......................... 327/333; 327/319; 327/437; 326/81
[58] Field of Search ..................................... 327/108, 333, 327/391, 437, 306, 309, 318, 319; 326/80, 81

[56] References Cited

U.S. PATENT DOCUMENTS

| | | | |
|---|---|---|---|
| 4,982,111 | 1/1991 | Nakaizumi | 327/208 |
| 5,369,313 | 11/1994 | Yoshihara | 326/68 |
| 5,493,245 | 2/1996 | Kao et al. | 327/333 |
| 5,825,207 | 10/1998 | Ito | 326/83 |

*Primary Examiner*—Timothy P. Callahan
*Assistant Examiner*—An T. Luu
*Attorney, Agent, or Firm*—Pascal & Associates

[57] ABSTRACT

A translation circuit for mixed logic voltage signals is comprised of a first pair of self-biasing common-mode level shifters for receiving positive and negative polarity input signals respectively of a balanced input signal, each level shifter having a control input for receiving a ratio control signal, and having first level shifter nodes for providing the same polarity output signals, a second pair of self-biasing common-mode level shifters, each connected in parallel with a corresponding variable ratio level shifter, the second pair of level shifters having fixed level shift ratios, a circuit connected to level shifter nodes of the second pair of level shifters for providing and storing a signal which is a sum of voltages appearing at the level shifter nodes, and a circuit for applying the stored signal to the control inputs.

10 Claims, 2 Drawing Sheets

HIGH SPEED LOW VOLTAGE SWING RECEIVER FOR MIXED SUPPLY VOLTAGE INTERFACES

FIELD OF THE INVENTION

This invention relates to a circuit for translating digital signals from circuits in a mixed voltage power supply system.

BACKGROUND TO THE INVENTION

Complementary symmetry metal oxide silicon integrated circuits (CMOS ICs) have been powered by the same power supply as other circuits supported by circuit boards on which they reside.

With the increasing number of gates on modern ICs, smaller geometry CMOS processes have become vital to maintain area and power consumption at acceptable levels. However, the transition to smaller geometry processes is coupled with a reduction in the gate oxide thickness. The susceptibility of the thinner gate oxide to damage from high voltages precludes the use of traditional 5V logic level CMOS input signals. This mandates the need for circuitry to bridge the interface between mixed voltage levels.

As the state of the art transitions to lower voltages, there are many legacy requirements that mandate the ability of ICs to handle mixed supply voltage inputs, e.g. 5V referenced PECL levels passing to 3.3V ICs, 3.3V referenced PECL levels passing to 2.5V ICs. Circuits are needed to receive these higher voltage input signals and reduce them to acceptable levels so that they can be handled by the lower voltage ICs.

Recently, a good deal of effort has been directed to a method interfacing higher voltage digital inputs with lower voltage ICs. These methods do not allow for the retention of the small signal content. Inputs are read as logic high or logic low. The need to reduce common-mode voltage levels on small signal inputs has also become necessary.

One solution to the above problems is to AC-couple the high voltage input to the low voltage IC. However AC-coupling has a disadvantage in that it causes base line wander due to the small time constant of the coupling capacitor.

Additionally, the component count increases due to both the coupling capacitors and the resistors required to set the common-mode levels. The common-mode can be set internally, removing the requirement for off-chip biasing resistors. However this forces the use of an internal reference generator, increasing cost.

A circuit that would provide translation between higher voltage AC signals to lower voltage ICs, such as between 5.0 volts and 3.3 volts, or between 3.3 volts and 2.5 volts, without attenuating the AC signals or introducing excess distortion, and at minimum cost is thus highly desirable. Further, the circuit should not sacrifice electrostatic discharge robustness, and it should not require AC-coupling.

SUMMARY OF THE INVENTION

The present invention provides translation between higher voltage AC signals to lower voltage ICs. It does not attenuate the AC signals nor does it introduce excess distortion. The circuit does not sacrifice electrostatic discharge robustness, and it is able to handle DC-coupling. Further, various embodiments can translate either balanced or unbalanced AC input signals or both.

In accordance with an embodiment of the invention, a translation circuit for mixed logic voltage signals is comprised of a first pair of self-biasing common-mode level shifters for receiving positive and negative polarity input signals respectively of a balanced input signal, each level shifter having a control input for receiving a ratio control signal, and having first level shifter nodes for providing the same polarity output signals, a second pair of self-biasing common-mode level shifters, each connected in parallel with a corresponding variable ratio level shifter, the second pair of level shifters having fixed level shift ratios, a circuit connected to level shifter nodes of the second pair of level shifters for providing and storing a signal which is an average of voltages appearing at the level shifter nodes, and a circuit for applying the stored signal to the control inputs.

BRIEF INTRODUCTION TO THE DRAWINGS

A better understanding of the invention will be obtained by considering the detailed description below, with reference to the following drawings, in which.

DETAILED DESCRIPTION OF EMBODIMENTS OF THE INVENTION

Figure 1:
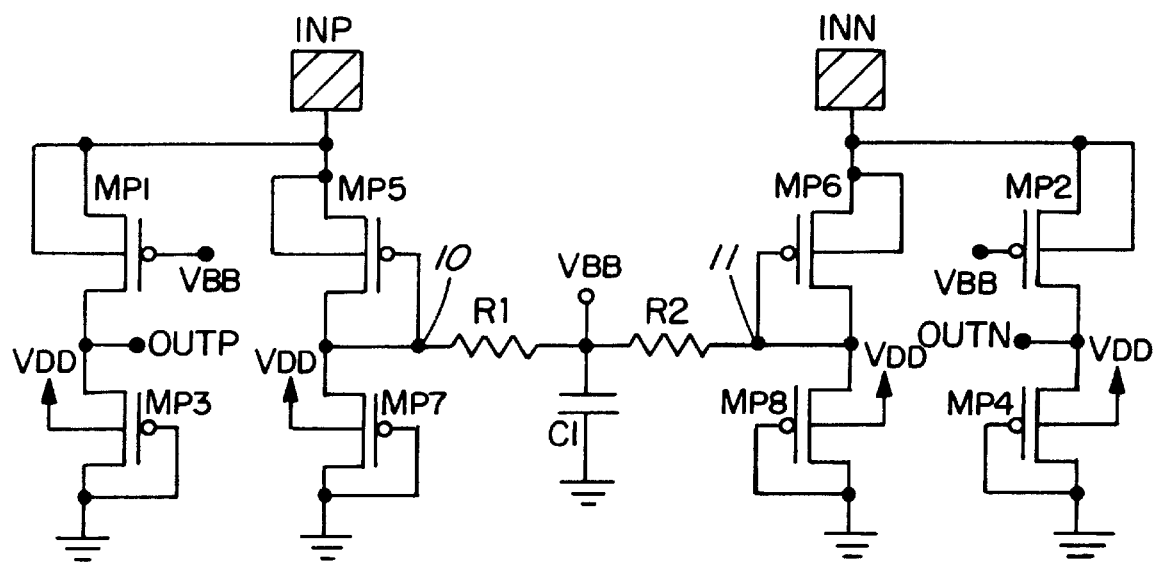
FIG. 1 is a schematic diagram of an embodiment of the invention.

A preferred embodiment of the invention is illustrated in FIG. 1. A pair of PMOS FETs MP1 and MP3 are connected in series, the drain of FET MP1 being connected to the source of FET MP3. The junction of the FETs MP1 and MP3 form an output node OUTP. The source and substrate of FET MP1 are connected together and to an input INP. The substrate of MP3 is connected to a power supply, having positive potential VDD. The gate of FET MP3 is connected to the drain of FET MP3 and to ground.

The above circuit is duplicated as pairs of FETs MP5 and MP7, MP6 and MP8, and MP2 and MP4. The source of FET MP5 is connected to input INP, and the sources of FETs MP6 and MP2 are connected to input INN. The inputs INP and INN receive balanced input signals INP and INN. The junction of FETs MP2 and MP4 form an output node OUTN.

The gates of FETs MP1 and MP2 are control inputs, for receiving a control input VBB. The gates of FETs MP5 and MP6 are connected to their respective drains, which, being joined to the sources of FETs MP7 and MP8, form output nodes 10 and 11 as described above.

The latter output nodes are connected to opposite terminals of a pair of series connected resistors R1 and R2, the junction of which is connected to one terminal of a capacitor C1. The other terminal of capacitor C1 is connected to ground. Alternatively, the other terminal of capacitor C1 can be connected to the positive power supply instead of to ground. The junction of the resistors and capacitor is connected to the control input VBB.

The input signals INP and INN are preferably received directly from the bond pads of the IC. The positive polarity signal INP is passed directly to the sources of FETs MP1 and MP5, and the negative polarity signal INN is passed directly to the sources of FETs MP6 and MP2.

MP1 and MP3 form a common-gate amplifier to amplify and level-shift the positive input. MP2 and MP4 form a common-gate amplifier to amplify and level-shift the negative input. MP1 and MP2 form drivers. MP3 and MP4 form diode-connected active loads. This basic circuit topology allows for the receiving of high-speed signals.

The common-gate of these amplifiers is biased by the reference voltage, VBB, which is extracted from the common-mode of the input signals. FETs MP5–MP8 form a replica stage that extracts this common-mode signal across the RC network formed by resistors R1 and R2 and capacitor C1. The geometries of MP5 and MP6 should match those of MP1 and MP2. The geometries of MP7 and MP8 should match those of MP3 and MP4.

MP5 and MP7 divide the positive input voltage down and apply it to one side of the RC network. MP6 and MP8 divide the negative input voltage down and apply it to other side of the RC network. These voltages generate a common-mode voltage across the capacitor C1 that biases MP1 and MP2 into saturation. This common-mode voltage is level-shifted down by the same amount as OUTP and OUTN.

The common-gate amplifiers act to amplify the input signals to generate signals OUTP and OUTN. In the process these signals are level-shifted down to levels that can be passed to a 3.3V differential pair without producing an excess voltage across its gate oxide.

The bulk nodes (i.e. the substrates) of MP1 and MP2 are tied to their respective sources. This is to combat the body effect and hence to prevent modulation of the transconductance gm of the driver transistors. Alternatively, in a P-well process the bulks of MP1 and MP2 can be tied to the positive power supply rail.

The bulk nodes, (i.e. the substrates) of MP3 and MP4 are tied to the positive supply rail. This minimizes the capacitance across their diffusion/bulk junction and hence allows for faster switching at nodes OUTP and OUTN.

The gain from INP (or INN) to OUTP (or OUTN) is given by the transconductance gm ratio of MP1/MP3 (or MP2/MPR4). This gain is constrained by the need to limit the voltage across any gate oxide.

As the ratio of MP1/MP3 (MP2/MP4) increases, the voltage at OUTP (OUTN) will also increase. This will increase the voltage across the gate oxide of MP3 (MP4). This places an upper bound on the gain.

As the ratio of MP1/MP3 (MP2/MP4) decreases, the reference voltage, VBB, will also decrease. With a high common-mode input and a low reference voltage, the voltage across the gate oxide of MP1 (or MP2) will become excessive. This places a lower bound on the gain.

This circuit also provides several other advantages. By dividing down the input signals, the common-mode range into a following stage is also divided down. This reduces the common-mode range that the following stage must handle without reducing the differential signal. Because the biasing is extracted from the input signals and not the power supply, this circuit is resilient to noise on the power supply. Since the inputs are divided down when extracting the bias voltage, all common-mode noise is also divided down.

The inputs feed directly to serial PMOS devices. Even with minimum channel lengths these devices provide robust ESD performance.

Potential applications of the circuit in FIG. 1 often require the ability to receive a single-ended input to indicate the status of the differential inputs. The replica biasing circuitry of FIG. 1 generates a common-mode signal that is shifted down by the same amount as the differential inputs. This common-mode signal can be used as a level-shifted reference to compare a level-shifted single-ended input against, as will be shown in the embodiment of FIG. 2.

Figure 2:
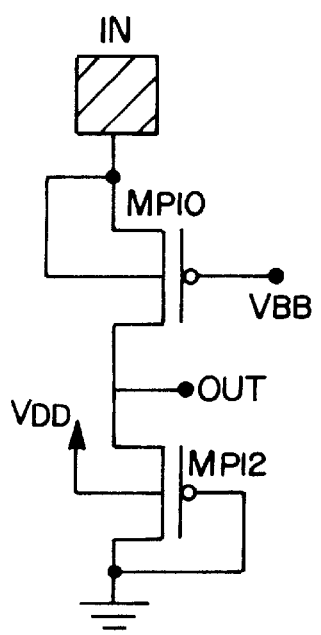
FIG. 2 is a schematic diagram of another embodiment of the invention.

FIG. 2 shows an additional common-gate amplifier that can be used in conjunction with the circuit in FIG. 1.

This circuit is similar to each of the four common-gate/dividing circuits as shown in FIG. 1, and is comprised of PMOS FET MP10 having its source connected to a single ended (unbalanced) input IN from which a signal IN is received, and its drain to the source of a PMOS FET MP12. The substrate of FET MP10 is connected to the input IN and the substrate of FET MP12 is connected to the power source VDD. Alternatively, the substrate of FET MP10 could be connected to the positive power supply rail. The gate and the drain of FET MP12 are connected to ground. The junction of the FETs MP10 and MP12 form an output node OUT. The gate of FET MP10 forms a divider ratio control input for receiving the voltage VBB.

This circuit is biased by the same VBB signal that was generated in the circuit of FIG. 1. The input, IN, is amplified and level-shifted to produce the output, OUT, in the same manner as the differential signals of FIG. 1.

Since VBB is level-shifted by the same amount as OUT it can be used by a subsequent stage as a reference to differentially compare OUT against. This allows for the addition of a single-ended input with minimal additional circuitry.

Applications may arise that necessitate the bypass of the level-shifting provided by the circuit in FIG. 1 and in FIG. 2. For instance, it may be desirable to allow an IC to receive either inputs from a different supply voltage (e.g. 5V referenced ECL with a 3.3V IC or 3.3V referenced ECL with a 2.5V IC) or inputs from the same supply voltage (e.g. LVDS or 3.3V referenced ECL on a 3.3V IC or LVDS on a 2.5V IC).

When receiving inputs referenced to the same supply voltage, the level-shifting becomes unnecessary. This can be achieved by configuring the basic circuit into that shown in FIG. 3. This allows for the ability to bypass the circuit in FIG. 1. The bypass circuitry is not exposed to high voltages across its gate oxides even if the level-shifting circuitry is not being bypassed.

Figure 3:
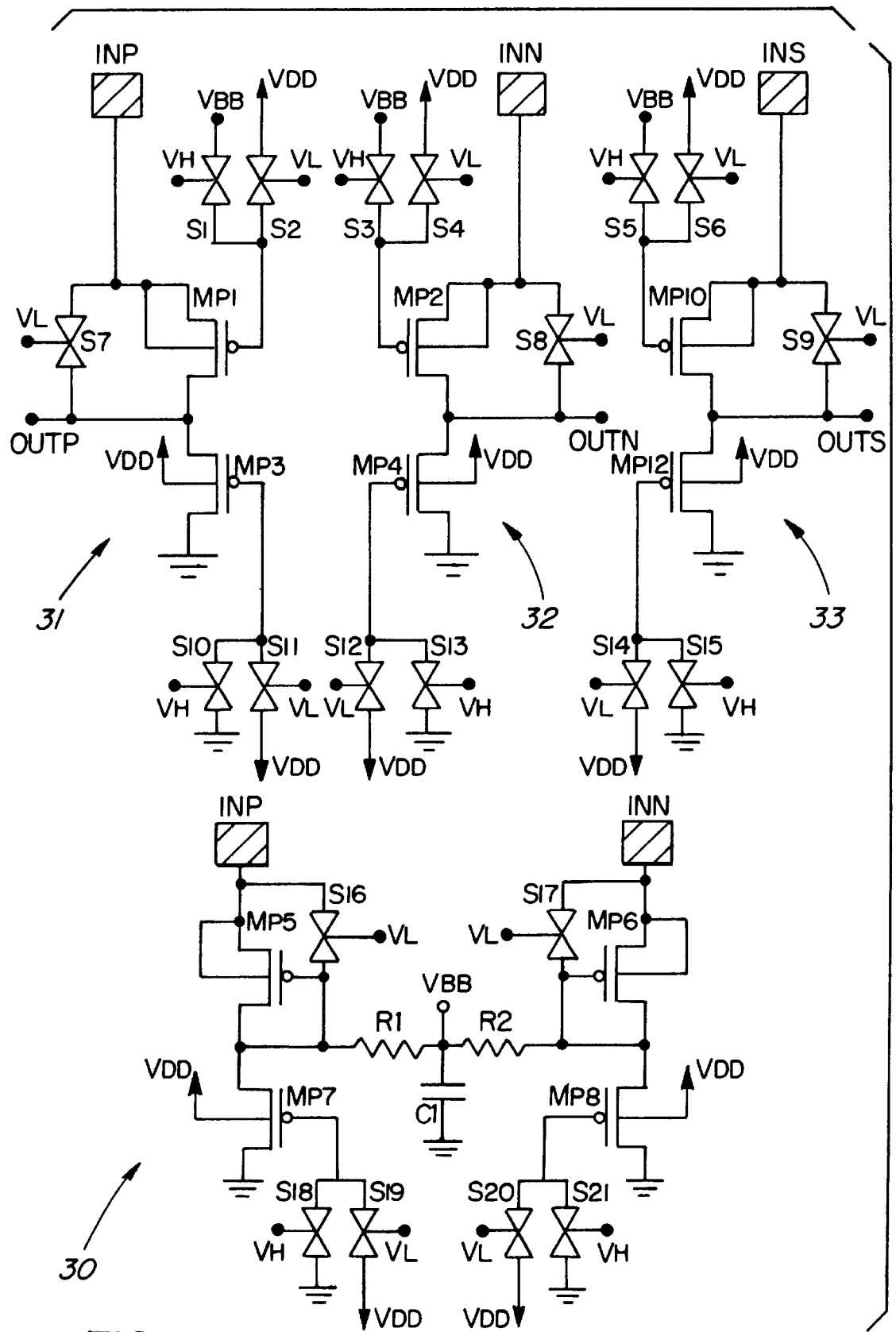
FIG. 3 is a schematic diagram of still another embodiment of the invention.

The circuit in FIG. 3 involves the addition of several analog switches S1–S21 to the previous two circuits. These are controlled by logic signals VH and VL. VH and VL are complementary signals that indicate whether the device is to operate in high voltage mode or low voltage mode.

Except for the switches Sx, which will be described below, the circuit of FIG. 3 is comprised of sub-circuits 30, 31 32 and 33 which together are similar to the circuit of FIG. 1. The circuit 33 is similar to the circuit of FIG. 2.

Switches S7, S8 and S9 are connected between the source and drain electrodes of respective FETs MP1, MP2 and MP10. Switches S16 and S17 are connected between the source and gate electrodes of FETs MP5 and MP6. Their control inputs are indicated as VL.

Switches S1, S3 and S5 are connected between the respective gates of FETs MP1, MP2 and MP10 to a node for receiving the control voltage VBB, i.e. to the junction of resistors R1 and R2 and capacitor C1 of circuit 30. Switches S2, S4 and S6 are connected between the respective gates of FETs MP1, MP2 and MP10 and the power source VDD.

Switches S10, S13 and S15 are connected between the bases of respective FETs MP3, MP4 and MP12 and ground. Switches S11, S12 and S14 are connected between the gates of respective FETs MP3, MP4 and MP12 and the power source VDD. Switches S18 and S21 are connected between the gates of respective FETs MP7 and MP8 and ground.

Switches S19 and S20 are connected between the gates of respective FETs MP7 and MP8 and the power source VDD. The control inputs of switches S1, S3, S5, S10, S13, S15, S18 and S21 are designated as VH, and the control inputs of switches S2, S4, S6, S11, S12, S14, S19 and S20 are designated VL.

While VH is enabled to be high, VL is enabled to be low. This forces S2, S4, S6, S7, S8, S9, S11, S12, S14, S16, S17, S19, S20 off. The circuit reduces to the basic circuit in FIG. 1 with the addition of the single-ended input from FIG. 2 (MP10 and MP12 form the single-ended level-shifter).

However, with VL high and VH low the basic circuit is drastically changed.

S1, S3, S5 are now turned off and S2, S4, S6 are turned on. The common gate drivers, MP1, MP2 and MP 10 now have their gates switched from VBB to VDD. This forces them off and effectively removes them from the circuit (except for a capacitive loading on nodes OUTP, OUTN, and OUTS).

S10, S13, S15 are turned off and S11, S12, S14 are turned on. This turns MP3, MP4 and MP12 off and effectively removes them from the circuit (except for a capacitive loading on nodes OUTP, OUTN and OUTS).

S7–S9 are turned on and pass inputs directly through to the next stage without any level shifting. Unlike the previous switches, S7–S9 are in an AC path and attention must be paid to their resistive and capacitive loading. As well they are metallically connected to the bond pads and are susceptible to ESD, latch-up, and excessive voltage across their gate oxides.

Figure 4:
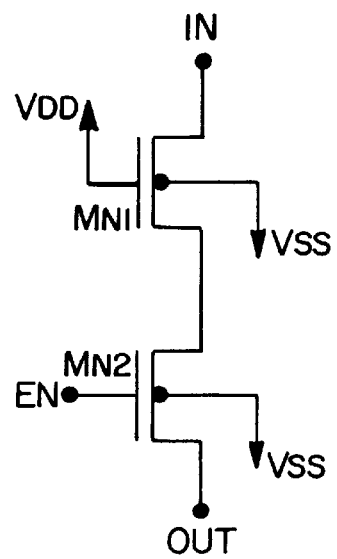
FIG. 4 is a schematic diagram of a switch which can be used in the embodiment of FIG. 3.

A preferred form of switch used for S7–S9 is shown in FIG. 4, although other forms of switches which fulfill the required function can be used.

The preferred switch is comprised of a pair of NMOS FETs MN1 and MN2, having their source-drain circuits connected together. Their substrates are connected to ground (VSS). The gate of FET MN1 is connected to the power source VDD, and the gate of FET MN2 is connected to an enable input, which will be voltage VL. The other terminals of the source-drain circuit is connected to the source and drain of the respective FETs MP1, MP2 and MP10.

If a single pass transistor were used for the switch, it would be susceptible to a high voltage across its gate oxide when the input signal was at a high voltage and the enable was low. This switch acts to divide the high input voltage across two transistors, MN1 and MN2, so as to limit the potential drop across any one gate oxide. MN1 has its gate connected to the low voltage power supply. This constrains the intermediate node (between MN1 and MN2) to be at most VDD–VTN. The difference between this voltage and the highest possible input voltage is the maximum potential drop across MN1. VDD–VTN is the maximum potential drop across MN2.

When the circuit is in low voltage mode, EN will be asserted and the switch will pass the input signal through to the output. Since the intermediate node is limited to a maximum drop of VDD–VTN it cannot pass a voltage greater than this. However, this switch is only active in low voltage mode and so never needs to pass a high voltage signal.

It is undesirable to use PMOS devices for the switches in this situation, since it would be necessary to bias their substrates to the low voltage supply. This would cause a leakage current when the input signal rose above the low voltage supply.

This switch provides a good resilience to an ESD event since it is composed of two series transistors.

Returning to the circuit of FIG. 3, in low voltage mode S19, S20 are on and S18, S21 are off. This turns MP7 and MP8 off. S16, S17 are biased on which shorts MP5 and MP6. The replica bias circuit has been reduced to R1, R2 and C1. This allows the inputs to pass directly to the RC network. The common mode now extracted is derived from INP and INN without any level shifting. This allows for the generation of a reference voltage against when the level shifter is being bypassed.

S16–S17 are connected to the bond pad and so use the same circuit structure as shown in FIG. 4. Again, this prevents them from high voltages when they are off.

It is also possible to bypass the level-shifting stage without the need to generate control signals VH and VL. If the common mode is too low the level shifter should be bypassed. Since VBB is the level shifted common mode of the input signal, it can be sensed and used to determine whether the level shifter is required. This alleviates the need for control signals to be supplied external to this circuit.

A person understanding this invention may now conceive of alternative structures and embodiments or variations of the above. All those which fall within the scope of the claims appended hereto are considered to be part of the present invention.

We claim:

1. A translation circuit for mixed logic voltage signals comprising:
    (a) a first pair of self-biasing common-mode level shifters for receiving positive and negative polarity input signals respectively of a balanced input signal, each level shifter having a control input for receiving a ratio control signal, and having first level shifter nodes for providing the same polarity output signals,
    (b) a second pair of self-biasing common-mode level shifters, each connected in parallel with a corresponding variable ratio level shifter of said first pair of level shifters, the second pair of level shifters having fixed level shift ratios and output modes,
    (c) a circuit connected to said output nodes of the second pair of level shifters for providing and storing a signal which is a sum of voltages appearing at said second level shifter nodes, and
    (d) a connection for applying said stored signal to the control inputs of said first pair of level shifters.

2. A translation circuit for a pair of analog voltage signals of mutually opposite voltage levels of a balanced input signal comprising:
    (a) a first pair of self-biasing common-mode level shifters, each comprising a common gate amplifier including a circuit for level shifting an input having a first voltage level to an output signal having a second voltage level, and having a control input for controlling the level shifting ratio thereof,
    (b) each of the first pair of level shifters having an output node for providing said the output signal therefrom,
    (c) each of the first pair of level shifters having its control input connected to a control node thereof,
    (d) a second pair of self-biasing common-mode circuits of similar structure to said first pair of level shifters for shifting a polarity of the input signal the same as that of the first pair of level shifter circuits, and
    (e) a summing circuit connected to output nodes of the second of the level shifter circuits for obtaining a voltage which is a sum of the voltages appearing at the output nodes of the second of the level shifter circuits said summing circuit being connected to the control nodes of the first pair of level shifters for applying the sum voltage to the control inputs of the first pair of level shifters.

3. A translation circuit as defined in claim 2 in which said summing circuit is comprised of a series of two resistors having opposite ends connected to the output nodes of the second of the level shifter circuits and a junction connected to a capacitor connected between the junction and either ground or a voltage VDD, said junction being connected to the control nodes of said first pair of level shifters.

4. A translation circuit as defined in claim 3 in which each of the level shifter circuits is comprised of a pair of PMOS field effect transistors (FETs) in which the drain of a first of the pair of FETs is connected to the source of the other of the pair of FETs, the source of the first of the pair of FETs is connected to an input terminal and the source and the gate of the second of the FETs are connected to ground, the gate of the first of the pair of FETs of the first level shifter circuit comprising the control input, the gate of a first of the pair of FETs of the second level shifter circuit being connected to the junction of the second pair of FETs, a substrate of the first of the pair of FETs of all of the level shifters being connected to its source or to the voltage VDD depending on a type of substrate type of the pair of FETs, and a substrate of the second of the pair of FETs of all of the level shifters being connected to a power source.

5. A translation circuit as defined in claim 3 including a further level shifter circuit of similar structure to one of the level shifter circuits of each pair, for receiving an input signal referenced to ground, and a circuit for connecting said junction to a control input of the further level shifter circuit, and further including an output node.

6. A translation circuit as defined in claim 4, including a further level shifter circuit of similar structure to one of said level shifter circuits, for receiving an input signal referenced to ground, a gate of one of a pair of FETs of the further level shifter circuit being a control input connected in a circuit to said junction and having an output node connected to a second junction of the pair of FETs of the further level shifter circuit.

7. A translation circuit as defined in claim 4 further including first bypass switches, having a control input VL, connected across the source-drain circuit of each of the first of the pair of FETs, second bypass switches, having a control input VH, connected between the gates of each of the second of the FETs and ground, third switches, having said control input VL, connected between the gates of the second of the FETs and said power source, fourth switches, having said control input VH connected between the gates of each of the first of the pair of FETs and said junction, fifth switches, having said control input VL connected between the gates of each of the first of the pair of FETs and said power source, wherein application of complementary signals to respective inputs VH and VL cause corresponding ones of the switches to close or remain open, and thereby enable operation of the translation circuit or causes bypass of the translation circuit whereby an input signal is passed to the output nodes without level shifting or gain.

8. A translation circuit as defined in claim 6 further including first bypass switches, having control input VL, connected across the source-drain circuits of each of one of the pair of FETs, second switches, having control input VH, connected between the gates of the other of the FETs and ground, third switches, having control input VL, connected between the gates of the other of the FETs and said power source, fourth switches, having control input VH connected between the gates of each of the one of the pair of FETs and the junction of the resistors, fifth switches, having control input VL connected between the gates of each of the one of the pair of FETs and said power source, wherein application of complementary signals to respective inputs VH and VL cause corresponding ones of the switches to close or remain open, and thereby enables operation of the translation circuit or causes bypass of the translation circuit whereby an input signal is passed to the output nodes without level shifting or gain.

9. A translation circuit as defined in claim 7 in which each of the FETs is a PMOS FET, the power source is of positive potential, and in which each of the first bypass switches is comprised of a pair of NMOS FETs having the source of one NMOS FET and the drain of another of NMOS FET connected together, another drain and source of the pair of NMOS FETs being connected to a corresponding source and drain of a one of the pair of PMOS FET, substrates of the NMOS FETs being connected to ground, a gate of one of the NMOS FETs connected to the power source, and the gates of the other of the NMOS FETs forming the control input VL.

10. A translation circuit as defined in claim 8 in which each of the FETs is a PMOS FET, the power source is of positive potential, and in which each of the first bypass switches is comprised of a pair of NMOS FETs having the source of one NMOS FET and the drain of another of NMOS FET connected together, another drain and source of the pair of NMOS FETs being connected to a corresponding source and drain of a one of the pair of PMOS FETS, substrates of the NMOS FETs being connected to ground, a gate of one of the NMOS FETs connected to the power source, and the gates of the other of the NMOS FETs forming the control input VL.

* * * * *